(12) United States Patent
Ku et al.

(10) Patent No.: US 6,972,606 B2
(45) Date of Patent: Dec. 6, 2005

(54) DELAY CIRCUITS AND RELATED APPARATUS FOR EXTENDING DELAY TIME BY ACTIVE FEEDBACK ELEMENTS

(75) Inventors: Wei-Ming Ku, Tao-Yuan (TW); Yu-Ming Hsu, Hsin-Chu (TW); Wei-Wu Liao, Taipei Hsien (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 10/708,104

(22) Filed: Feb. 10, 2004

(65) Prior Publication Data

US 2005/0030079 A1    Feb. 10, 2005

(30) Foreign Application Priority Data

Aug. 6, 2003    (TW) .............. 92121553 A

(51) Int. Cl.$^7$ .......................................... H03H 11/26
(52) U.S. Cl. ...................... 327/284; 327/277
(58) Field of Search ................ 327/261, 276–278, 327/280, 281, 284, 285, 291, 299, 485, 487

(56) References Cited

U.S. PATENT DOCUMENTS

| | | | | |
|---|---|---|---|---|
| 3,541,352 A | * | 11/1970 | Merrill et al. .............. 327/278 |
| 3,975,598 A | * | 8/1976 | Green et al. .............. 369/32.01 |
| 5,629,644 A | * | 5/1997 | Chevallier .................. 327/393 |
| 5,859,571 A | * | 1/1999 | Lee et al. ...................... 331/53 |
| 5,969,557 A | * | 10/1999 | Tanzawa et al. ............ 327/291 |
| 6,356,161 B1 | * | 3/2002 | Nolan et al. ................ 331/176 |

* cited by examiner

Primary Examiner—Timothy P. Callahan
Assistant Examiner—Cassandra Cox
(74) Attorney, Agent, or Firm—Winston Hsu

(57) ABSTRACT

A delay circuit and related apparatus for providing a longer delay time, such that when a level of an input signal changes, a level of an output signal changes accordingly after the predetermined delay time. The delay circuit has a storage unit, a current generator, a voltage generator for providing a reference voltage, a differential amplifier, and a feedback control module. The current generator starts to provide a charging current to the storage unit when the input signal changes level, such that an output charging voltage of the storages unit is gradually charged to reach the reference voltage. The feedback control module is capable of dynamically decreasing the charging current provided to the storage unit as the charging voltage is approaching the reference voltage, and the amplifier will change the level of the output voltage when the charging voltage reaches the reference voltage.

8 Claims, 14 Drawing Sheets

DELAY CIRCUITS AND RELATED APPARATUS FOR EXTENDING DELAY TIME BY ACTIVE FEEDBACK ELEMENTS

BACKGROUND OF INVENTION

1. Field of the Invention

The present invention relates to delay circuits and a related apparatus, and more particularly, to delay circuits and a related apparatus for extending delay time with active feedback elements.

2. Description of the Prior Art

In the modern information-oriented society, many data are processed, stored, and transmitted conveniently by electrical signals. Engineers are researching and developing various kinds of circuits of specific functions to meet different demands.

In modern circuits, the memory in which data can be written, read, and erased in a nonvolatile manner, like flash memory, has become one of the most important non-volatile storage media. Please refer to FIG. 1. FIG. 1 is the function blocks of a conventional flash memory 10. The flash memory 10 comprises a control circuit 12, a memory array 14, a charge pump 18, a limiter 17, a transmission circuit 20, and a delay circuit 16.

Please refer to FIG. 2 (and also FIG. 1). FIG. 2 illustrates a waveform timing diagram of each related signal when the flash memory 10 is programming and erasing data. The horizontal axis in FIG. 2 represents time and the vertical axis represents the waveforms.

As shown in FIG. 2, when control circuit 12 starts data-programming/data-erasing at the time point ts, the signal Sp will transfer from level L to level H at the time ts and trigger the charge pump 18 to charge to voltage Va. The limiter 17 also triggered by the signal Sp limits the voltage Va to a stable level VA after the voltage Va raises to this level. Meanwhile, the limiter 17 will trigger the delay circuit 16 with the signal Si when the voltage Va equals level VA. According to the triggering signal Si, the control circuit 12 will pass the voltage Va, which is generated by the charge pump 18 and reaches the level high enough, through the transmission circuit 20 to the memory array 14 to program/erase data.

As shown in FIG. 2, when the voltage Va is increased to the level VA at the time t0, the limiter will transfer the signal Si from level L to level H at this time, triggering the flash memory 10 to program/erase data and starting operation of the delay circuit 16. When the delay circuit 16 senses the change of the input signal Si, it changes the signal level So after a predetermined time delay TD. As shown in FIG. 2, when the delay circuit 16 is triggered by the level change of the signal Si at the time t0, after a delay time TD, the output signal So will transfer from level L to level H at the time t1. The delay time TD is the time for the flash memory 10 to complete data-programming/data-erasing. According to the level change of the signal So at the time t1, it makes sure that the control circuit 12 has enough time to complete data-programming/data-erasing.

As known by those skilled in the art, for the application described above, the delay time involved in the delay circuit 16 is generally about several μs (1 μs is one millionth of a second) to several ms (1 ms is one thousandth of a second), and even up to 100 ms. However, the ordinary logic delay circuits often have a delay time of several ns (1 ns is one billionth of a second) and these ordinary logic cells can hardly be used as the delay circuit 16 in the flash memory 10. In order to meet the requirement of the specific control mechanism of data-processing in the flash memory, the delay circuit 16 in the flash memory 10 has to be designed with special consideration.

Please refer to FIG. 3. FIG. 3 shows a conventional delay circuit 22. The delay circuit 16 is biased between the DC voltages Vs and Vg. A voltage signal Vi is taken as an input and a voltage signal Vo is taken as an output. To implement the delay circuit 16 in FIG. 1, the delay circuit 22 includes a p-type MOSFET Mp0, an n-type MOSFET Mn0, a resistor R, a capacitor C and an inverterI0. Gates of the transistors Mp0 and Mn0 are connected to node N1 to receive the input signal Vi; drains of the transistors Mp0 and Mn0 are connected to node N2, and the resistor R and the capacitor C are connected to node N3. The inverter I0 inverts the voltage Vc of node N3 to the voltage signal Vo as the output of the delay circuit.

As known from the above description, the delay time of the conventional delay circuit in FIG. 3 is the time that it needs to discharge the capacitor C through the resistor R by the current In; this time is proportional to the multiplication of the capacitance and the resistance. In other words, to implement the long time delay of the delay circuit 16 in FIG. 3, capacitance and resistance should be increased. This is one of the disadvantages of the conventional delay circuit. Large capacitance and large resistance require large layout area, so the layout area of the conventional delay circuit 22 cannot be reduced, increasing the production cost.

Please refer to FIG. 4. FIG. 4 is a conventional delay circuit 24, which is disclosed in U.S. Pat. No. 5,969,557. It receives a voltage signal Vpi as input and produces a voltage signal Vpo as output. The delay circuit 24 comprises a current generator 26, a voltage generator 28, a capacitor C0 for the storage unit and a differential amplifier Ap. The current generator 26 includes p-type MOSFETs Mp1 to Mp3. MOSFETs Mp2 and Mp3 form a current mirror to generate two current Ir0, Ic0 of a specific ratio. A source and a drain of the transistor Mp1 are connected to the DC bias Vs and the node Np2, respectively, and a gate is controlled by the signal Vpi. The voltage generator 28 includes n-type MOSFETs Mn1 and Mn2. A drain of the transistor Mn1 is connected to the node Np2 by the resistor R0, a source is biased at the DC voltage Vg, and a gate is controlled by the signal Vpi. A drain and a source of the transistor Mn2 are connected to the nodes Np3 and the DC bias Vg, respectively. A gate is controlled by the inverted signal Vpi of the inverter IP0. The positive and the negative ends of the differential amplifier Ap (marked as "+" and "−" in FIG. 4) are connected to the nodes Np3 and Np2 respectively. This differential amplifier receives the voltages Vpc and Vpr as inputs and produces signal Vpo as output.

As for the operation of the conventional delay circuit 24, please refer to FIG. 5 (and also FIG. 4). FIG. 5 illustrates a waveform timing diagram of each voltage signal in the operation of the delay circuit 24 in FIG. 4. The x-axis represents time and the y-axis represents voltage magnitude. As shown in FIG. 5, when the input signal Vpi maintains the level L (as before the time tp0), the transistor Mp1 is turned on and makes the transistors Mp2 and Mp3 turn off. The turned-on transistor Mp1 will keep the voltage Vpr of the node Np2 in the level H (like the level of the DC bias Vs), and the turned-on transistor Mn2 keeps the voltage Vpc of the node Np3 in the level L (like the DC voltage Vg of the ground). Because the voltage levels Vpc and Vpr, which are positive and negative inputs of the amplifier Ap, are L and H respectively, the output signal Vpo of the amplifier Ap before time tp0 will maintain the level L, as shown in FIG. 5.

At the time point tp0, the input signal Vpi increases to the level H from the level L, triggering the function of the delay circuit 24. When the signal Vpi reaches the level H at tp0, the transistor Mp1 turns off and the transistor Mn1 turns on. The turned-off transistor Mp1 makes the transistors of the current mirror Mp2 and Mp3 turn on and generate the current of a fixed ratio Ir0 and Ic0. In this situation, the current Ir0 is the reference current passing through the resistor R0 and generating a reference voltage Vpr with a stable level VR at the node Np2, as the voltage Vpr shows in FIG. 5. The current Ic0 is taken as a charging current, which charges the capacitor C0 through the node Np3 to gradually increase the voltage Vpc of the node Np3. As shown in FIG. 5, at the time point tp1, the voltage Vpc charged by the current Ic0 increases to more than the level VR, and the voltage Vpc of the positive input of the amplifier Ap is larger than that of negative input Vpr so that the output signal Vpo of the amplifier Ap becomes the level H at time tp1. In other words, the conventional delay circuit 24 delays the level change of the input signal Vpi at time tp0 to the level change of the output signal Vpo at time tp1 in order to implement the delay circuit. Time Td0 between time points tp0 and tp1 is the delay time involved in the conventional delay circuit 24.

Compared to the delay circuit 22 in FIG. 3, the delay circuit 24 in FIG. 4 implements the function of delay by charging the capacitor C0 directly with current Ic0 so that it reduces the layout area, which RC circuits of the delay circuit 22 occupy. However, the delay circuit 24 in FIG. 4 still has other disadvantages. First, the current mirror in the delay circuit 24 charges the capacitor C0 with a constant current Ic0, so the voltage of the capacitor Vpc will increase rapidly with time in a fixed speed during the period of charging, as shown in FIG. 5. Because the speed in which the fixed current Ic0 charges the capacitor C0 is too fast, it is hard to generate a long delay in the delay circuit 24. In addition, as shown in FIG. 5, when the voltage Vpc of the capacitor C0 is charged to the level VR at time tp1, current Ic0 will keep charging C0 until the time point tp2 when the voltage Vpc reaches the DC level Vs due to the characteristic of the delay circuit 24. In other words, even at time tp1 when the delay circuit completes the function of the delay, current mirror of the conventional delay circuit 24 still consumes extra power to charge the capacitor C0, resulting in waste of power.

SUMMARY OF INVENTION

According to the claimed invention, a delay circuit is proposed for providing an output signal according to an input signal so that when the level of the input signal changes from a first input level to a second input level, the level of the output signal changes from a first output level to a second output level after a predetermined delay time. The delay circuit includes a voltage generator for providing a reference voltage when the input signal changes from the first input level to the second input level and a current generator for providing a charging current when the input signal changes from the first input level to the second input level. The delay circuit includes a feedback control module having a control end and two transmit ends, the control end for receiving a charging voltage, and the feedback control module able to transmit the charging current from the current generator between the two transmit ends, and the feedback control module changing the proportion between a cross voltage of the two transmit ends and the current flowing between the two transmit ends. A storage unit is electrically connected to the current generator and the control end of the feedback control module for receiving the charging current from the feedback control module and thereby generating the charging voltage. The delay circuit also includes an amplifier having two input ends electrically connected to the storage unit and the voltage generator in order to receive respectively the charging voltage and the reference voltage, the amplifier able to change the level of the output signal from the first output level to the second output level when the relationship between the reference voltage and the charging voltage changes.

These and other objectives of the present invention will no doubt become obvious to those of ordinary skill in the art after reading the following detailed description of the preferred embodiment that is illustrated in the various figures and drawings.

DETAILED DESCRIPTION

In prior art, the method for implementing the delay function of the delay circuit is through charging or discharging with RC circuits or a fixed current. However, these conventional methods require larger layout area and are hard to generate a long period of delay time.

The delay circuit of the present invention comprises a current generator, a voltage generator, a storage unit (like a capacitor), a feedback control module formed by active devices, and a differential amplifier. When the level of the input signal changes and triggers functions of the delay circuit, the voltage generator generates a reference voltage and the current generator generates a reference current. Then the feedback control module passes the charging current to the storage unit to do charging or discharging, and increases or decreases the output voltage of the storage unit. The amplifier is used to compare the charging voltage and the reference voltage. When the comparison result between the charging voltage and the reference voltage changes, the amplifier triggers the level of the output signal to implement the function of delay. During the period of charging or discharging storage unit, when the charging voltage is close to the reference voltage, the feedback control module will dynamically decrease the charging current passed to the storage unit, leading to the slower speed in which the charging voltage approaches the reference voltage. Therefore, the delay circuit of the present invention can prolong the delay time effectively. In addition, the feedback control module is composed of active devices (like transistors) and can reduce the large layout area of the RC circuits.

Figure 6:
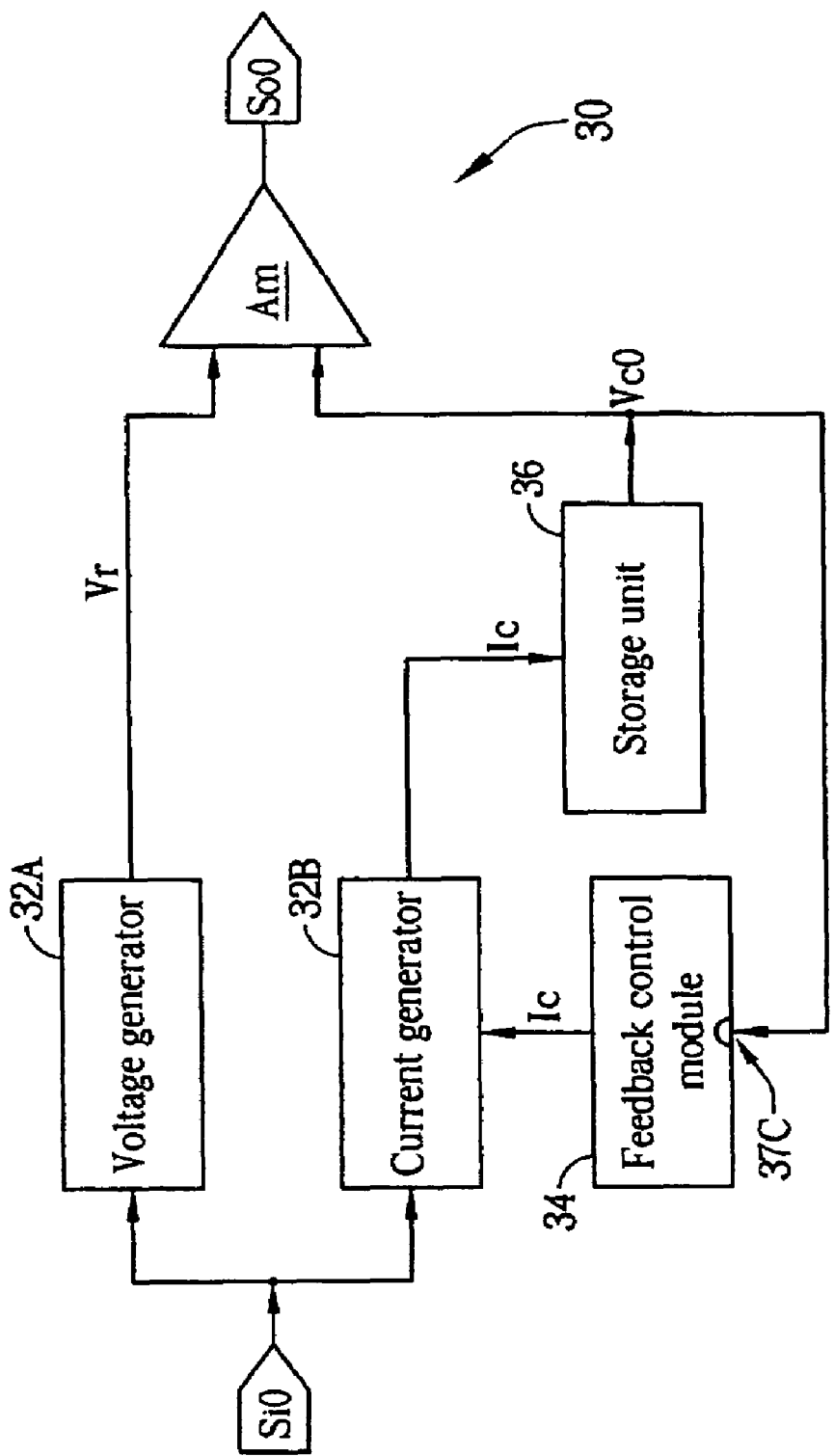
FIG. 6 illustrates function blocks of the delay circuit of the present invention.

Please refer to FIG. 6. FIG. 6 illustrates function blocks of the delay circuit 30 in the present invention. The delay circuit 30 receives the signal Si0 as input and outputs the signal So0. It transforms the level change of the signal Si0 to the level change of the signal So0 after a delay time. The delay circuit 30 has a voltage generator 32A, a current generator 32B, a feedback control module 34, a storage unit 36, and a differential amplifier Am.

When the level of the signal Si0 changes and triggers functions of the delay circuit 30, the voltage generator 32A generates a reference voltage Vr and the current generator 32B generates a reference current Ic. Then the feedback control module 34 passes the charging current Ic to the storage unit 36 through the feedback control module 34. The storage unit 36, which can be implemented by a capacitor, provides a charging voltage Vc0 according to the charging or discharging of current Ic. The charging voltage Vc0 will be passed to a control end 37C of the feedback control module 34 and the amplifier Am. The feedback control module 34 can dynamically adjust the charging current Ic passed to the storage unit 36 according to the charging voltage Vc0. At the same time, the amplifier keeps comparing the charging voltage Vc0 and the reference voltage Vr. When the comparison result between the charging voltage Vc0 and the reference voltage Vr changes during the period when the charging voltage is close to the reference voltage, the amplifier is triggered to change the level of the output signal So0 to implement the function of delay.

One of the characteristics of the present invention is that the feedback control module 34 dynamically adjusts the charging current Ic passed to the storage unit 36. In practical operation, the current generator 32B provides the charging current Ic and gradually changes the charging voltage Vc0 of the storage unit 36. The feedback control module 34 senses that the charging voltage Vc0 is close to the reference voltage Vr, and it will gradually decrease the charging current Ic passed to the storage unit 36, making slower the speed in which the charging voltage approaches the reference voltage. The time when the charging voltage Vc0 reaches the reference voltage Vr is extended, and thus the delay circuit 30 implements a longer delay time. In the preferred embodiment of the present invention, the feedback control module 34 is composed of active devices (like transistors) and can reduce the large layout area of the RC circuits.

Figure 7:
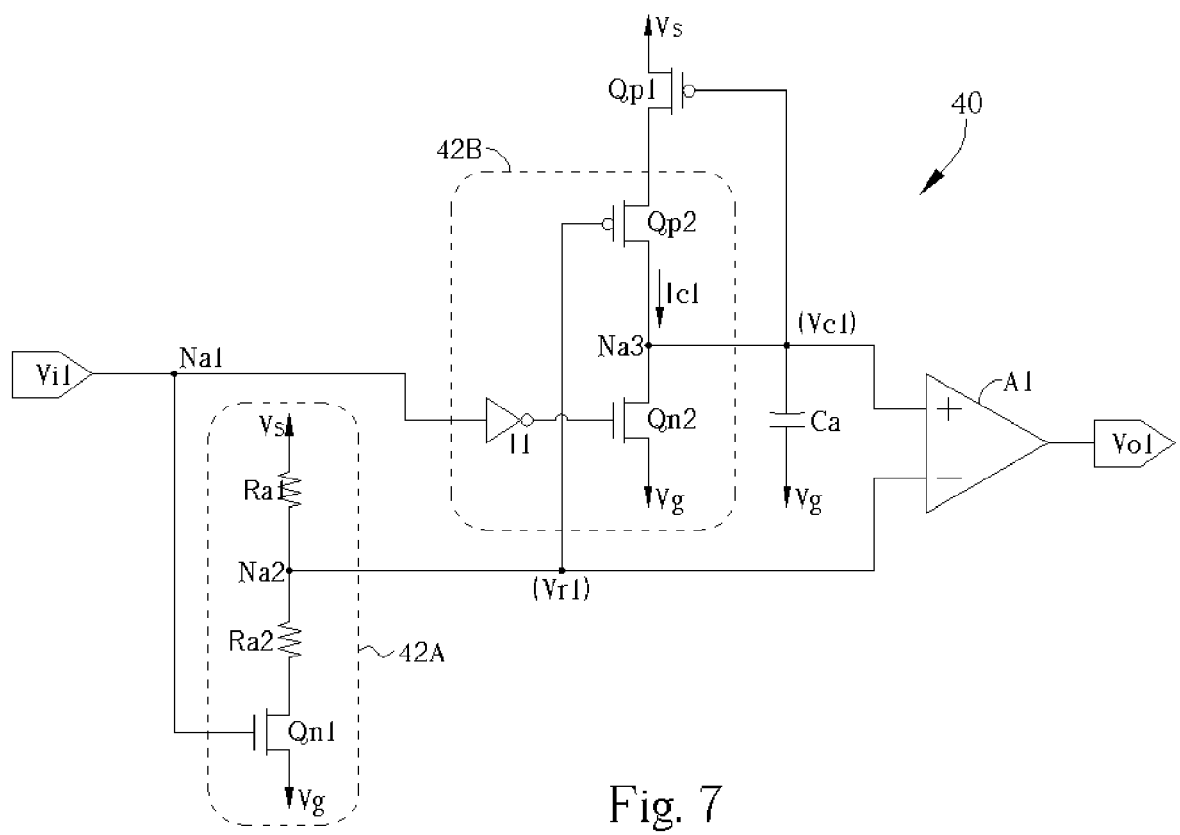
FIG. 7 illustrates a first embodiment of the delay circuit of the present invention.

Please refer to FIG. 7. FIG. 7 is a first embodiment of the delay circuit 40. The delay circuit 40 receives a voltage signal Vi1 as input and produces a voltage signal Vo1 as the outputs after delay. In the delay circuit 40, the resistor Ra1, Ra2 and an n-type MOSFET Qn1 form a voltage divider to implement the voltage generator 32A and produce a reference voltage Vr1 at the node Na2. Gate of the transistor Qn1 receives the trigger signal Vi1 at the node Na1. P-type MOSFET Qp2, n-type MOSFET Qn2, the inverter I1 form a current generator 42B, which generates a charging current Ic1 from the source and drain of the transistor Qp2. P-type MOSFET Qp1 is the feedback control module in the present invention. Gate is the control end, while drain and source, connected to the DC bias Vs and drain of the transistor Qp2 respectively, are transmit ends. The transistor Qp1 controls the current Ic1 of the current generator 42B. The capacitor Ca, the storage unit of the delay circuit 40, receives the current Ic1 at the node Na3 to produce a charging voltage Vc1 at the node Na3. The connection between the node Na3 and gate of the transistor Qp1 feeds back the voltage Vc1 to the control end of the transistor Qp1. The positive and negative inputs of the amplifier A1 (marked as "+" and "−" in FIG. 7) receive the voltage Vc1 and Vr1 respectively, and generate voltage signal Vo1 as the output signal of the delay circuit 40.

Figure 8:
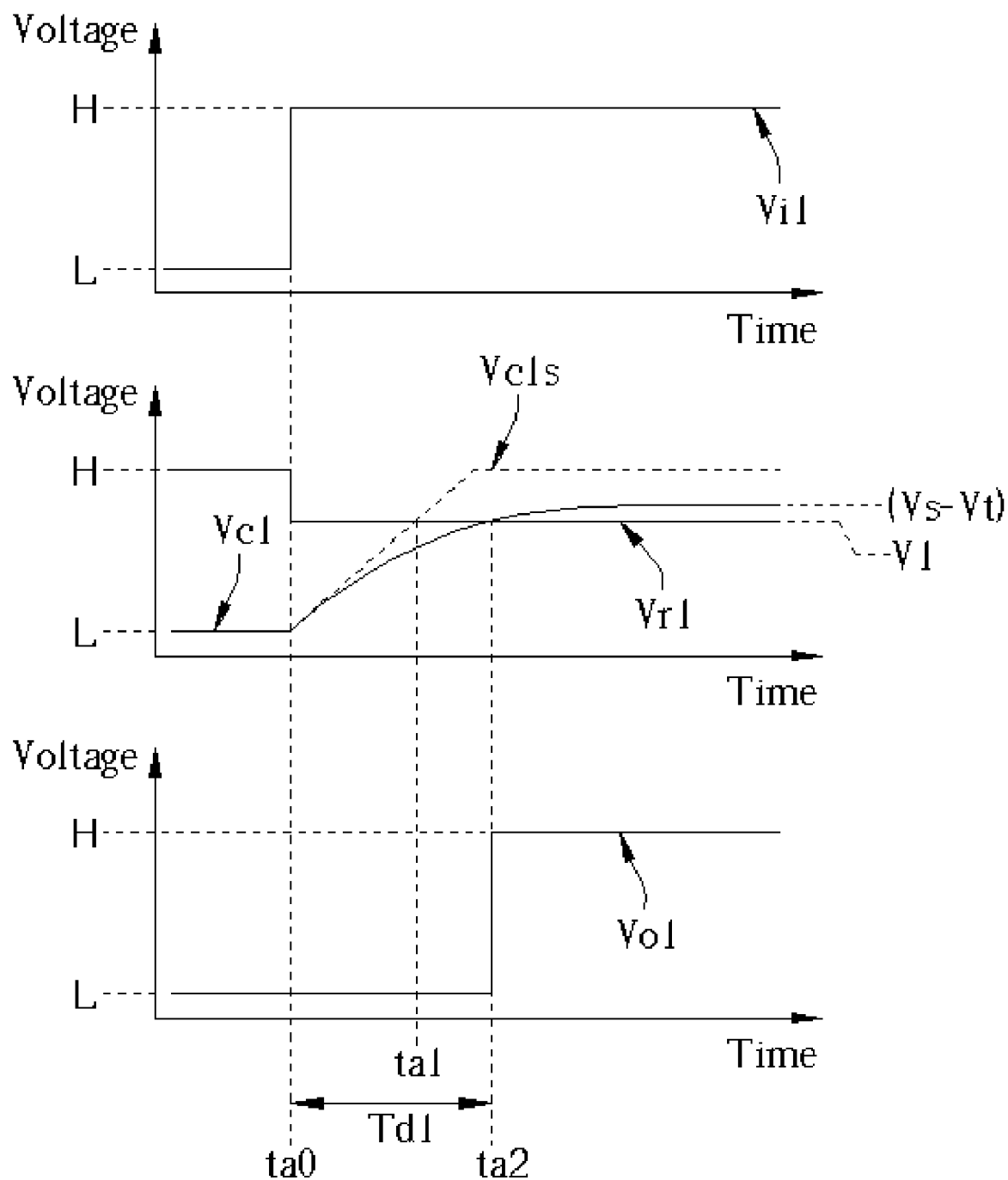
FIG. 8 illustrates a waveform timing diagram of each relative signal when the delay circuit in FIG. 7 is operating.

As for the operation of the delay circuit 40, please refer to FIG. 8 (also FIG. 7). FIG. 8 illustrates a waveform timing diagram of each voltage signal in the operation of the delay circuit 40 in FIG. 7. The x-axis represents time and the y-axis represents voltage magnitude. As shown in FIG. 8, before time ta0, input signal Vi1 maintains the level L, and the transistor Qn1 in the voltage generator 42A is off. The voltage of the resistor Ra1 is zero, keeping the voltage Vr1 in the DC level H like the voltage. Because the input signal Vi1 is in the level L, the inverted level H makes the transistor Qn2 of the current generator 42B turn on and pull the charging voltage Vc3 of the node Na3 to the level L. The reference voltage Vr1 maintaining the level H makes the transistor Qp2 off. Because voltage Vr1 is larger than voltage Vc1, the output signal Vo1 of the amplifier A1 maintains the level L.

At time ta0, input signal Vi1 transfers from the level L to the level H and starts triggering functions of the delay circuit 40. The signal Vi1 in the level H makes the transistor Qn1 in the voltage generator 42A conduct current, passing through the resistors Ra1, Ra2 and producing the stable DC voltage Vs at the node Na2. As shown in FIG. 8, after time ta0, the reference voltage Vr1 maintains the level V1, which is about Vs*Ra2/(Ra1+Ra2). After time ta0, input signal Vi1, which has transferred to the level H, makes the transistor Qn2 in the current generator 42B turn off. Accordingly, the transistors Qp2, Qp1 turn on, letting the charging current enter capacitor Ca through the node Na3 to charge the capacitor Ca. Meanwhile, voltage Vc1 at the node Na3 begins to increase at time ta0, as shown in FIG. 8. Voltage Vc1 reaches or even goes beyond the level V1 of the voltage Vr1 until time ta2. The output signal Vo1 of the amplifier A1 will transfer from the level L to the level H because the voltage Vc1 is larger than Vr1 at this time. In other words, the delay circuit 40 delays the level change of the input signal Vi1 at time ta0 for time Td1 (as shown in FIG. 8), and responds with the level change of output signal Vo1 at time ta2, achieving the function of delay.

As described before, one characteristic of the present invention is that the feedback control module decreases the charging current dynamically when charging/discharging the storage unit so as to lengthen the delay time. In the delay circuit 40, gate voltage of the transistor Qp1 in the feedback control module increases with the increase of the voltage Vc1 after time ta0. This makes the voltage between the source and gate of the transistor Qp1 decrease, and weakens conducting of the transistor Qp1. Accordingly, the current Ic1 entering the node Na3 in the current generator 42A gradually decreases, slowing down the increase of the voltage Vc1. As shown in FIG. 8, waveform of voltage Vc1 after time ta0 shows a concave decreasing curve, which means the increasing speed (that is the slope of the curve) becomes slower with time. Thus, it needs more time for voltage Vc1 to accumulate to the level V1. The present invention is based on this origin to implement the longer delay of the delay circuit. The transistor Qp1 in the feedback control module is equivalent to a changeable resistor. The equivalent resistor between source and drain changes dynamically with the gate voltage Vc1 and decreases conducting current Ic1 dynamically.

Figure 4:
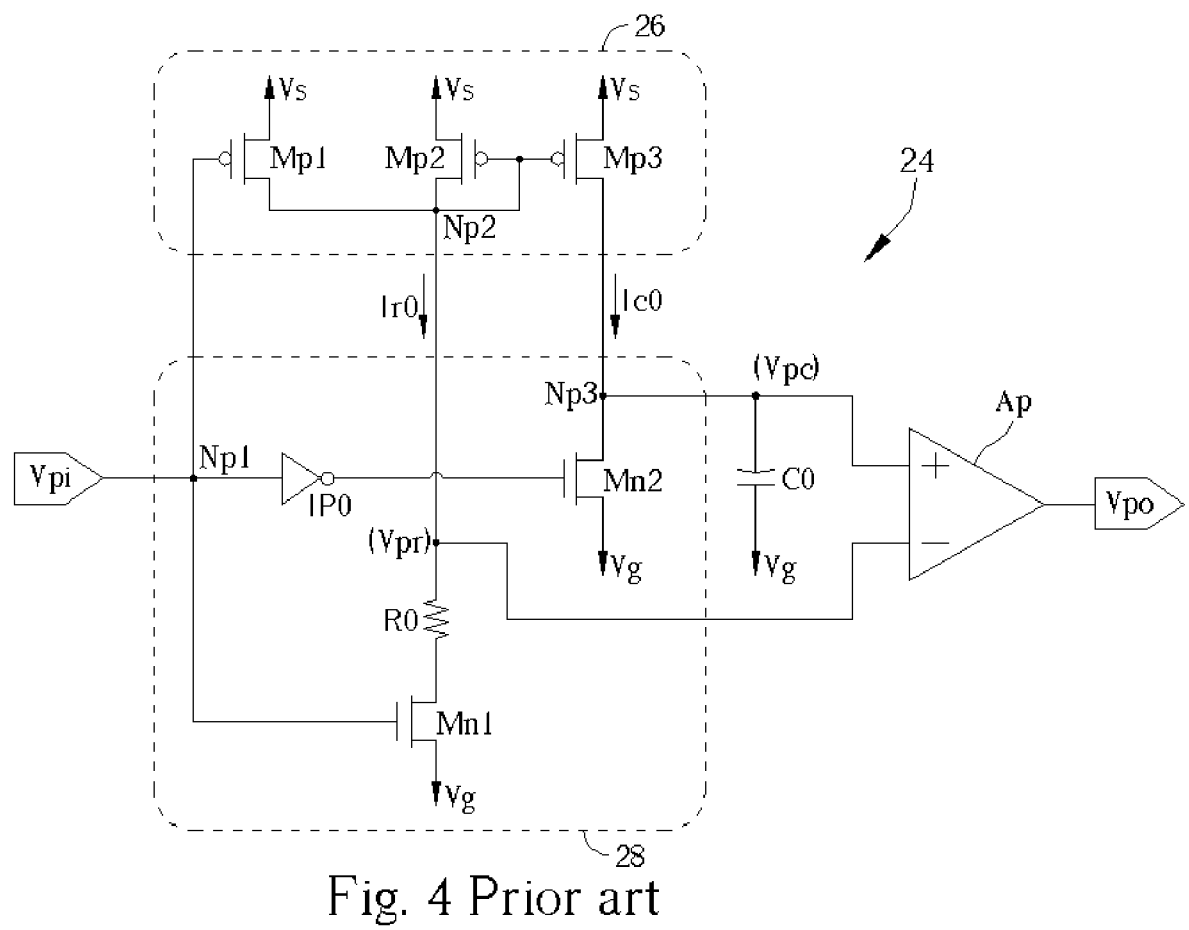
FIG. 4 illustrates another conventional delay circuit.
Figure 5:
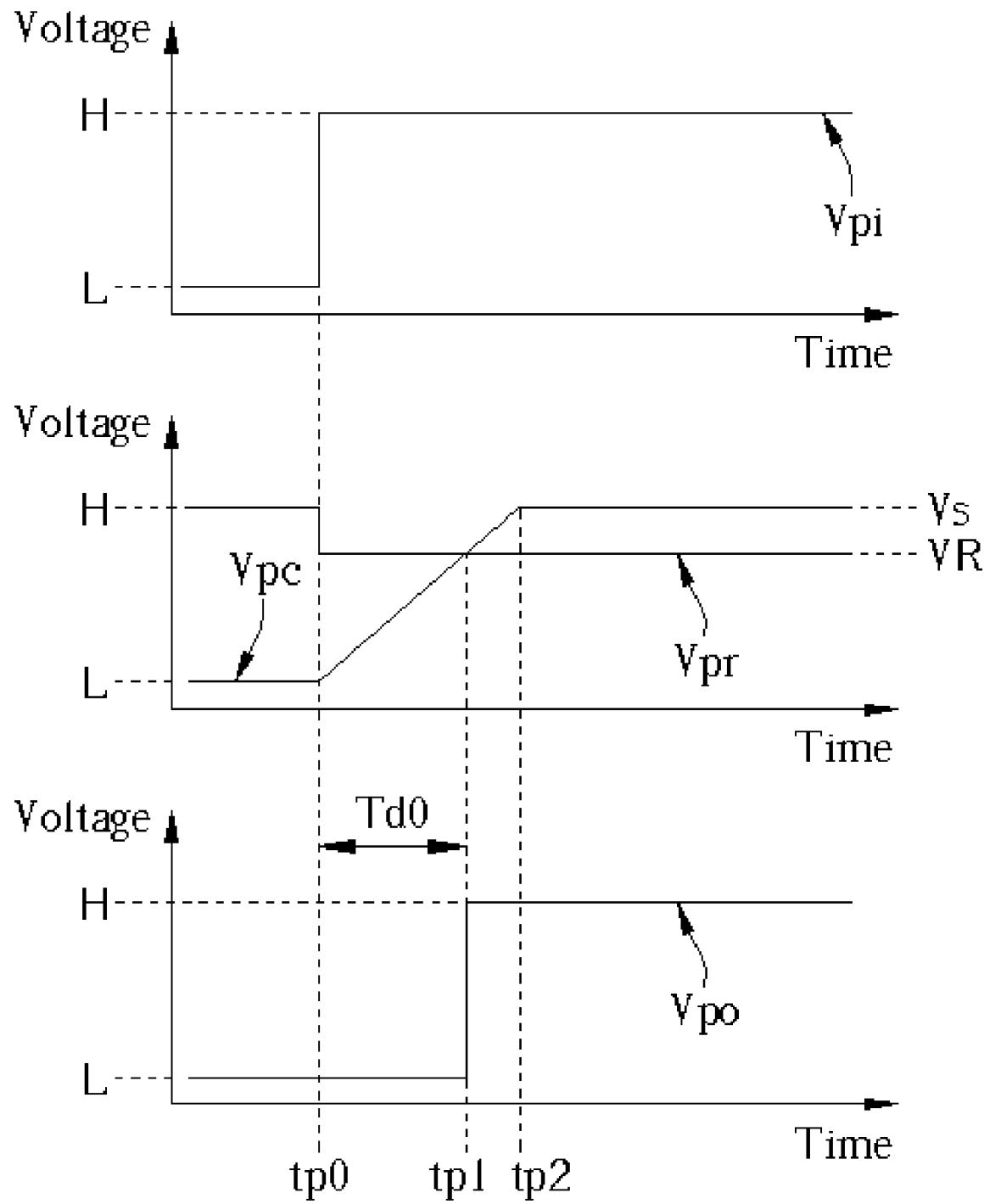
FIG. 5 illustrates a waveform timing diagram of each relative signal when the delay circuit in FIG. 4 is operating.

To describe the effect of the present invention, FIG. 8 shows the voltage waveform Vc1 s of the dotted line when voltage Vc1 increases if the circuit excludes the transistor Qp1. Without the transistor Qp1, the transistor Qp2 is a constant current source(like the current generator of the conventional delay circuit 24 in FIG. 4). In this case, voltage Vc1 will linearly increase rapidly, making voltage Vc1 charge to the level V1 and trigger the level change of output signal Vo1 in the advanced time ta1. Adding the transistor Qp1 for the feedback control module of the present invention decreases the charging current Ic1 dynamically when the capacitor Ca is charging. It lengthens the time when voltage Vc1 reaches the level V1 effectively, and implements a delay circuit with more delay time than the conventional delay circuit.

In addition, after adding the feedback control module in the present invention, the highest voltage level of the capacitor Ca is (Vs−Vt)(Vt is threshold voltage the transistor Qp1), due to the voltage between source and drain of the transistor Qp1. This will decrease power consumption that the capacitor Ca needs for charging. Comparatively, the conventional delay circuit 24 in FIG. 4 should charge the capacitor C0 to the higher level, consuming more power.

Figure 1:
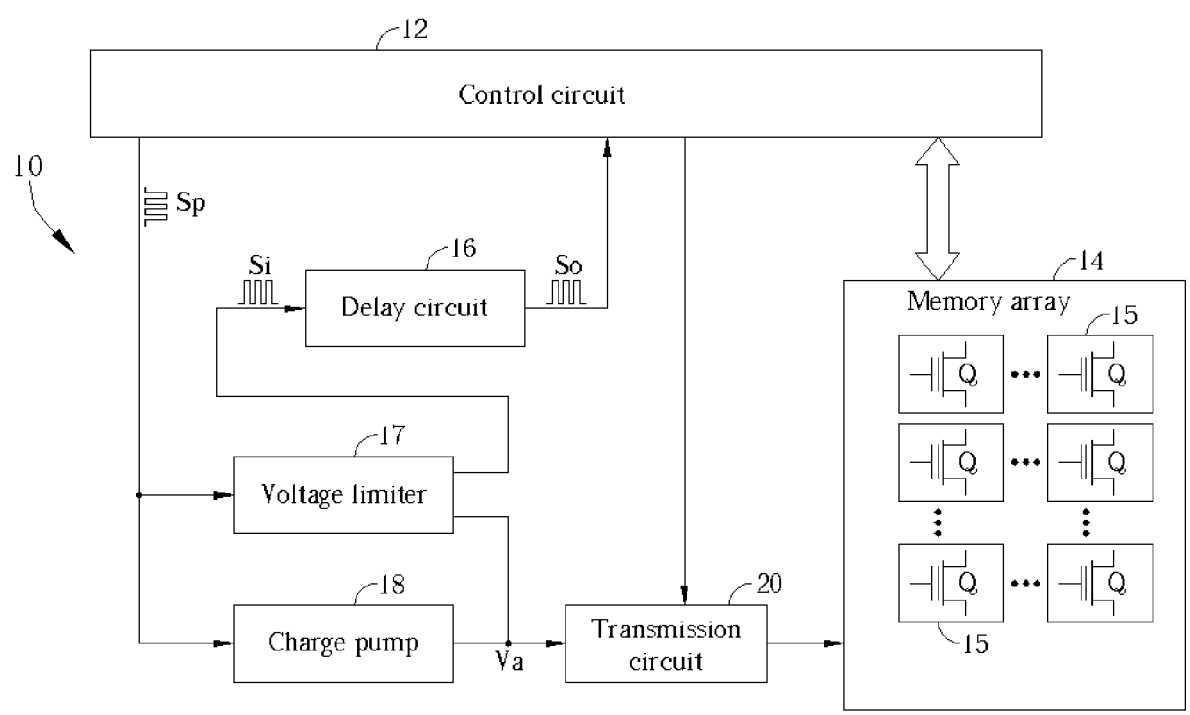
FIG. 1 illustrates function blocks of a conventional flash memory.
Figure 2:
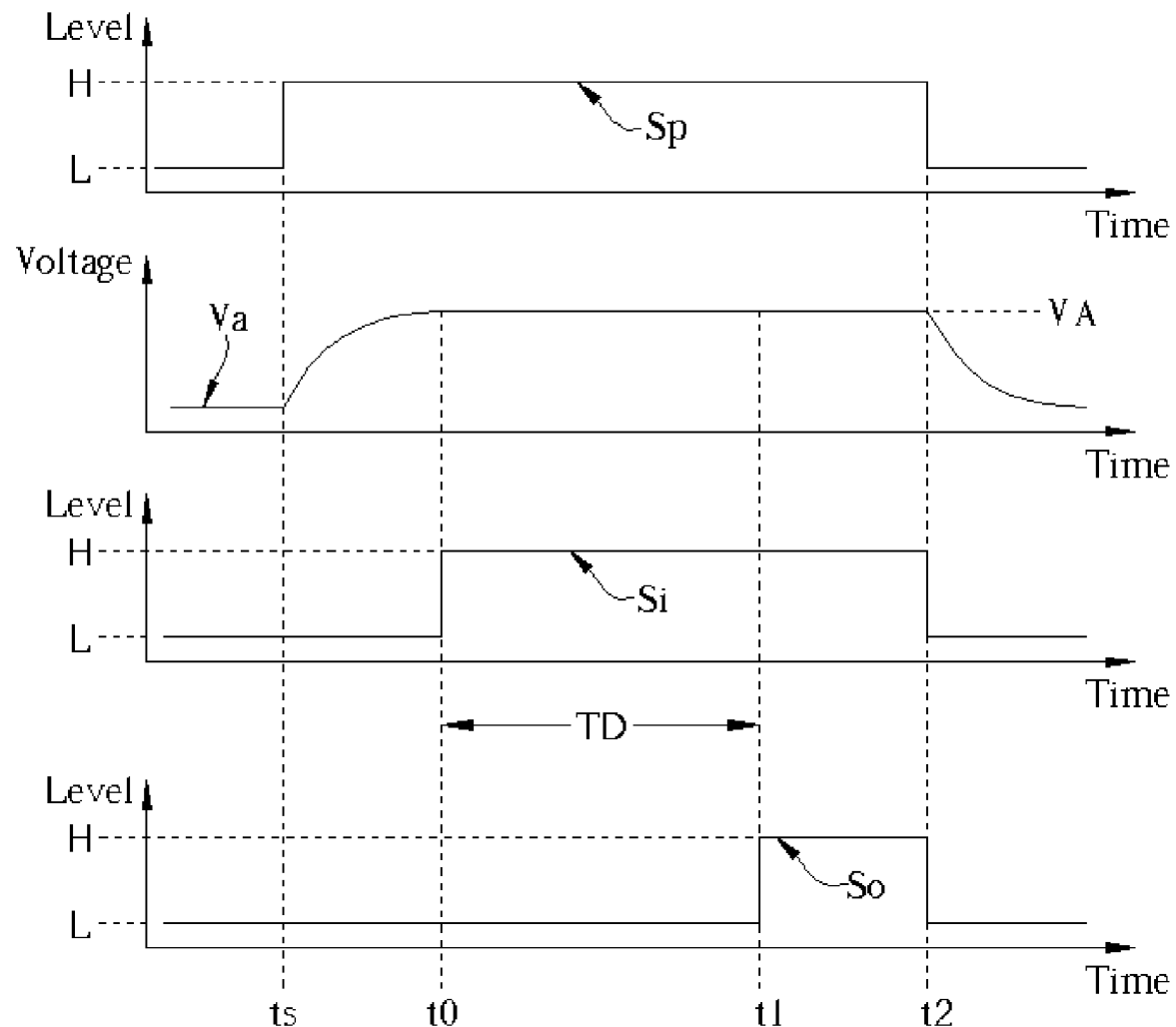
FIG. 2 illustrates a waveform timing diagrams of each relative signal when the flash memory in FIG. 1 is programming and erasing data.
Figure 3:
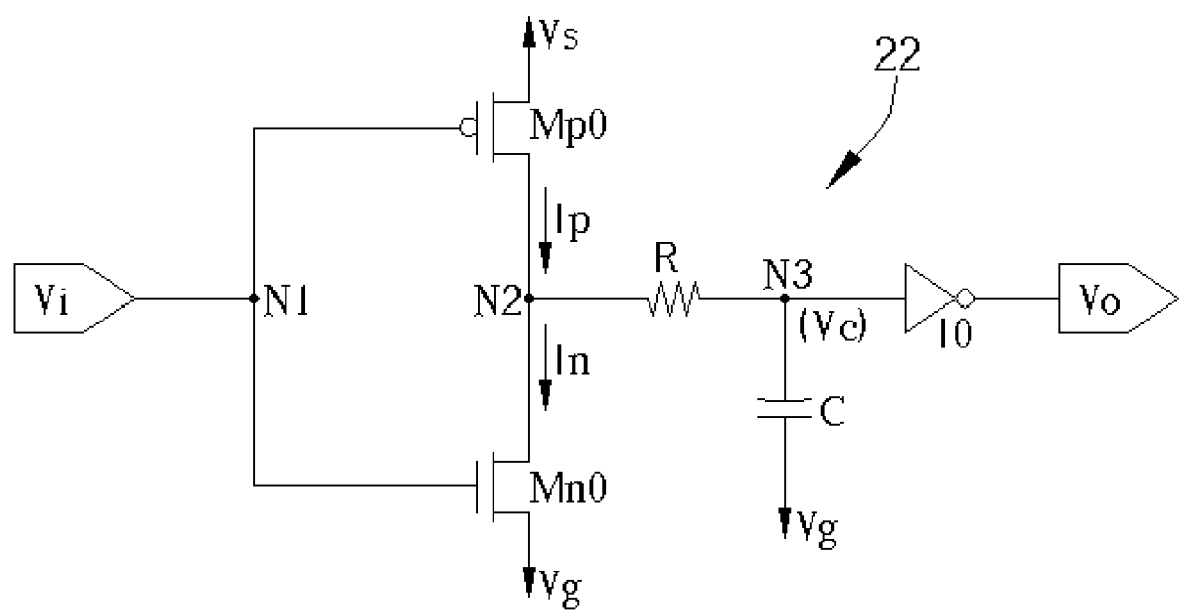
FIG. 3 illustrates a conventional delay circuit.

Because the feedback control module in the present invention is implemented by active devices, say transistors, it occupies less layout area. The conventional resistor-capacitor delay circuit 22 in FIG. 3 requires large layout area to implement the delay circuit with long delay. In addition, the delay circuit in the present invention can be reset rapidly. As shown in FIG. 7 and FIG. 8, if the input signal Vi1 becomes level L from the level H at time ta2 and resets the delay circuit 40, input signal Vi1 of the level L will turn on the transistor Qn2 by the high output level of the inverter I1, and the turned-on transistor Qn2 rapidly discharges the transistor Ca through the node Na3 directly. When the input signal Vi1 is in the level L, both the transistor Qp2 and the transistor Qp1 serving as the feedback control module are turned off, so they will not affect that the transistor Qn2 rapidly discharges the capacitor Ca. This also makes the delay circuit 40 in the present invention reset rapidly. Comparatively, the conventional delay circuit 22 in FIG. 3 cannot reset signals rapidly for charging/discharging the capacitor through the resistor.

Figure 9:
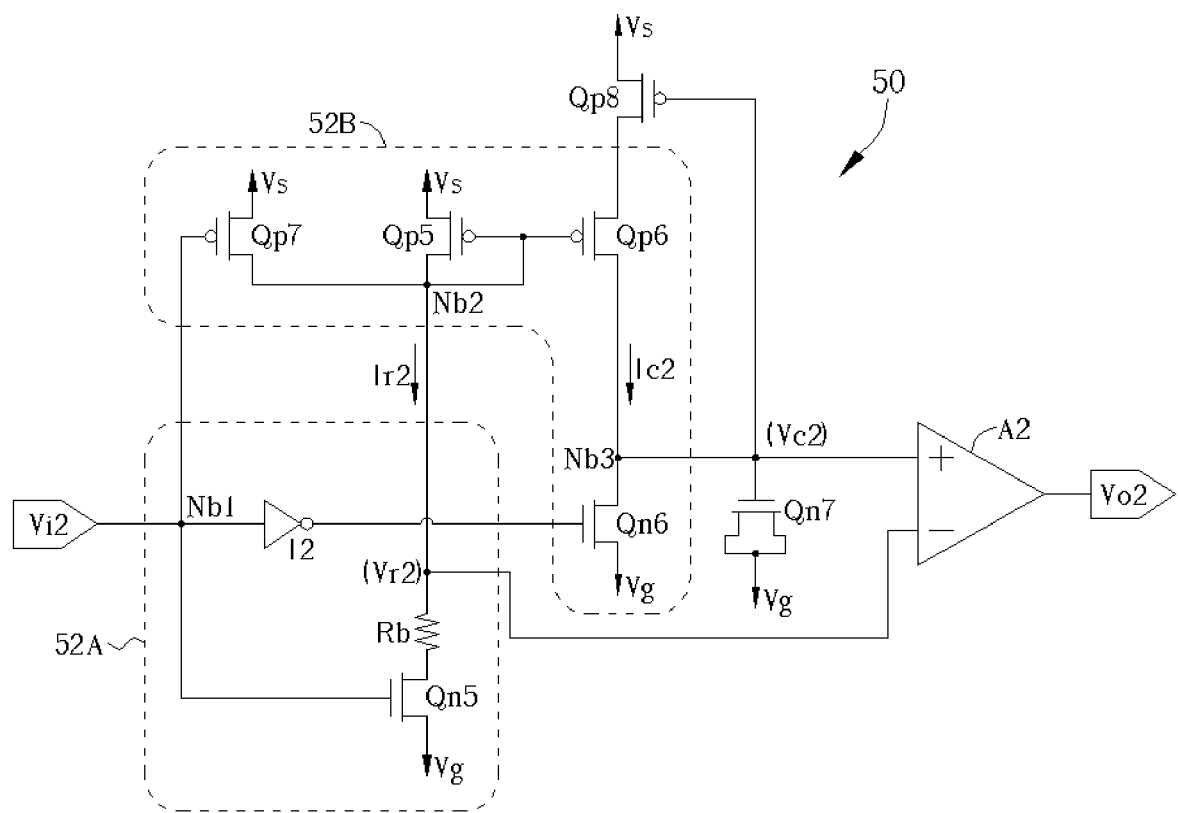
FIG. 9 illustrates a second embodiment of the delay circuit of the present invention.

Please refer to FIG. 9. FIG. 9 illustrates another embodiment of the delay circuit 50 in the present invention. The delay circuit 50 takes voltage signal Vi2 as an input signal and voltage signal Vo2 as an output signal. In the delay circuit 50, p-type MOSFETs Qp5 to Qp7 and n-type MOSFET Qn6 form the current generator 52B, and gates of the transistors Qp5, Qp6 are connected together to form a current mirror. When the current generator 52B starts operating, the transistors Qp5, Qp6 conduct a current Ir2 and a charging current Ic2 respectively. An N-type MOSFET Qn5 and the resistor Rb compose a voltage generator 52A. When the transistor Qn5 turns on, the voltage generator 52A receives the reference current Ir2 provided by the current generator 52B at node Nb2, and produces a reference voltage Vr2 at the node Nb2. Source and drain of the N-type MOSFET Qn7 are connected together to form a capacitor, which is the storage unit of the delay circuit 50 and receives current Ic2 from the node Nb3. Similarly, the delay circuit 50 of the present invention uses p-type MOSFET Qp8 as the feedback control module. Source and drain of the transistor Qp8 form two transmission ends to control current Ic2, and the gate connected at the node Nb3 receives voltage Vc2 as the control signal to dynamically adjust the current Ic2. Positive and negative ends of the amplifier A2 in the delay circuit 50 receive voltage Vc2 and Vr2 respectively, and the output voltage signal Vo2 is produced according to the relative magnitude of these two inputs.

Figure 10:
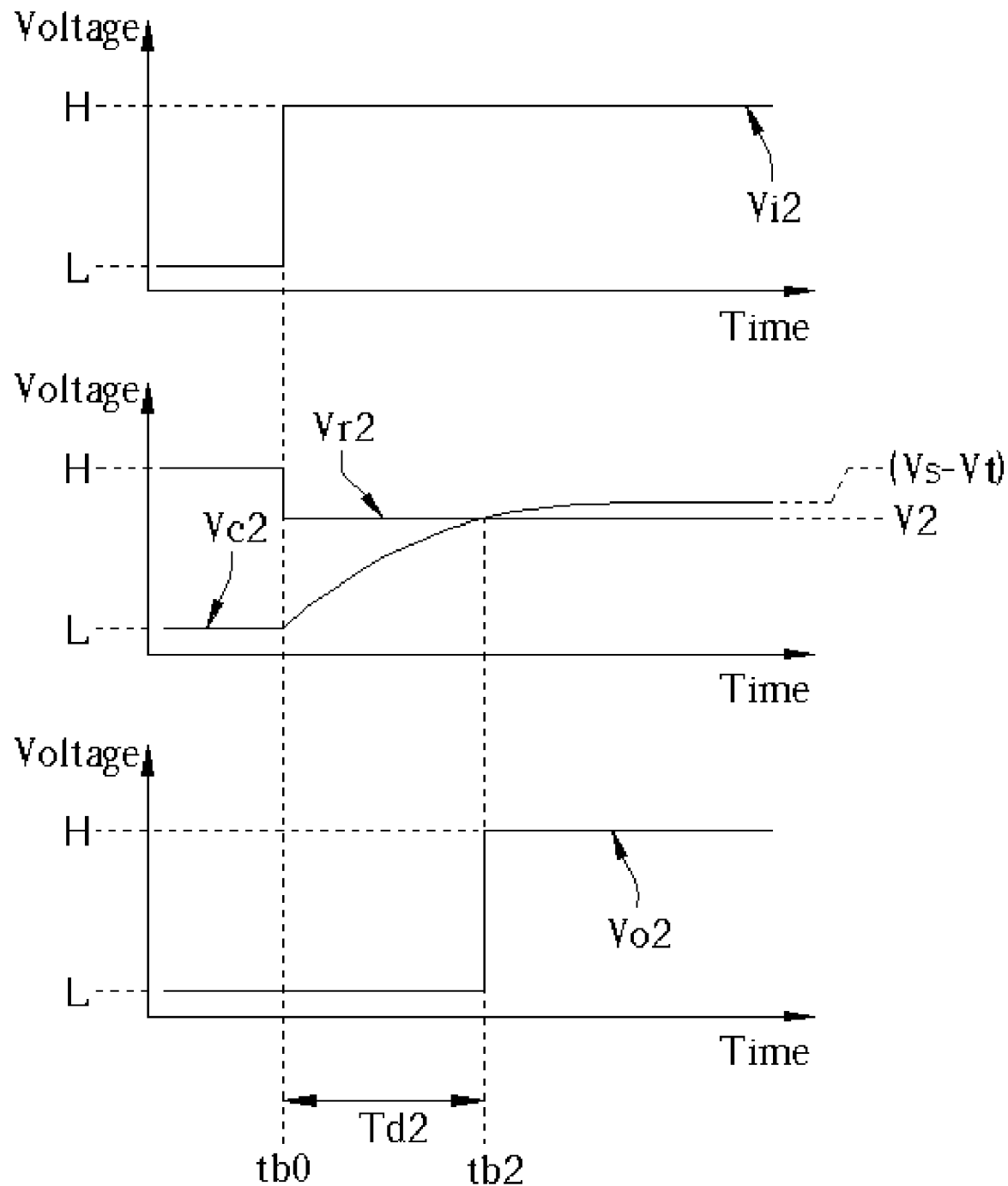
FIG. 10 illustrates a waveform timing diagram of each relative signal when the delay circuit in FIG. 9 is operating.

Please refer to FIG. 10 (also FIG. 9). FIG. 10 is a waveform timing diagram of each relative signal of the delay circuit 50 in FIG. 9. The horizontal axis represents time and the vertical axis represents voltage magnitude. As shown in FIG. 10, When the input signal Vi2 maintains the level L before time tb0, the on-transistor Qp7 and the off-transistor Qn5 will make the voltage Vr2 at node Nb2 short and become close to the level H, and turn off the transistors Qp5, Qp6 in the current generator 52B. The turned-on transistor Qn6 pulls the voltage Vc2 of the node Nb3 down to the level L. Because voltage Vc2 and Vr2 remain in the levels L and H respectively, output signal Vo2 of the amplifier A2 will remain in the level L.

Input signal Vi2 reaches the level H at time tb0 and triggers the delay circuit 50, turning on the transistor Qn5 and turning off the transistor Qp7. Accordingly the transistor Qp5, Qp6 and Qp8 turns on and provides currents Ir2, Ic2. The reference current Ir2 will go through the resistor Rb and produce a stable voltage Vr2 in the level v2 at node Nb2(V2 is almost equal to Ir2*Rb). Charging current Ic2 charges the storage unit, the transistor Qn7, through the node Nb3, and the voltage Vc2 at node Nb3 increases from the level L. Similar to the operation of the delay circuit 40 in FIG. 7, with the increase of the voltage at node Nb3, the transistor Qp8 as the feedback control module gradually leaves the turned-on mode, and current Ic2 also starts decreasing. Thus, the speed in which the voltage Vr2 increases is slower, and delay time becomes longer. At time tb2, charging voltage Vc2 goes beyond the level V2, and the amplifier A2 changes the signal Vo2 from the level L to the level H. During the level change of the signal Vi2, Vo2, delay time Td2 is generated.

Figure 11:
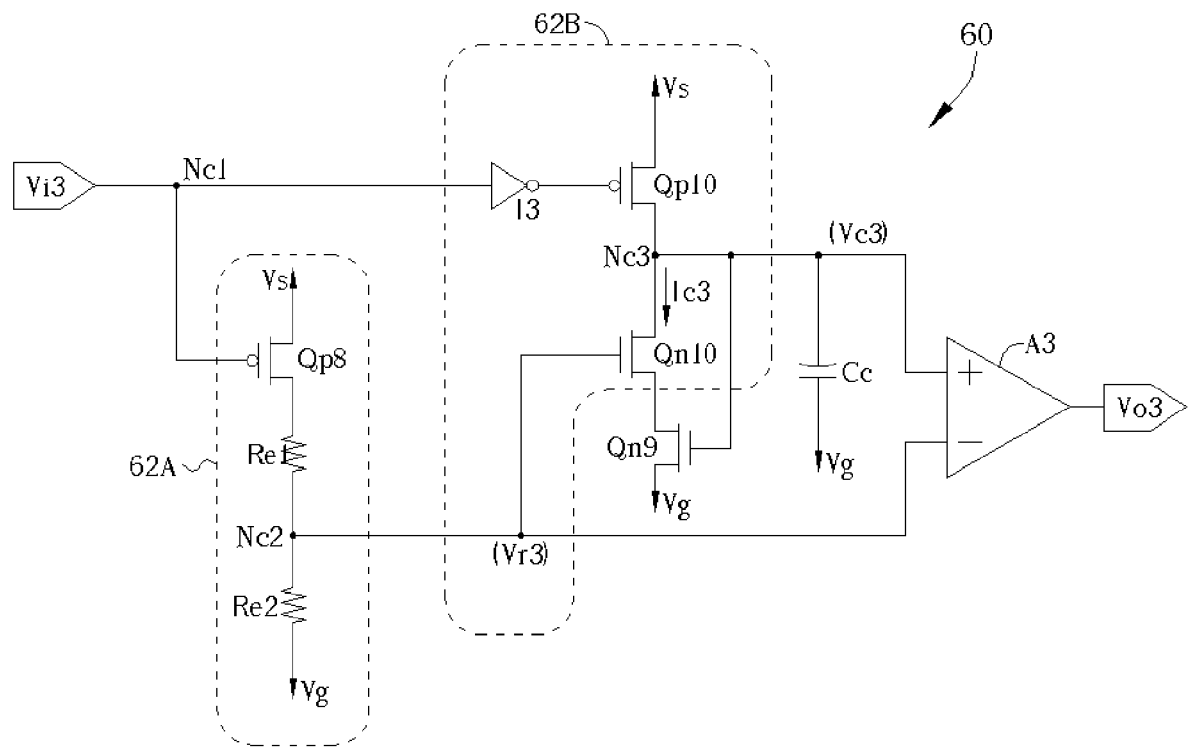
FIG. 11 illustrates a third embodiment of the delay circuit of the present invention.
Figure 12:
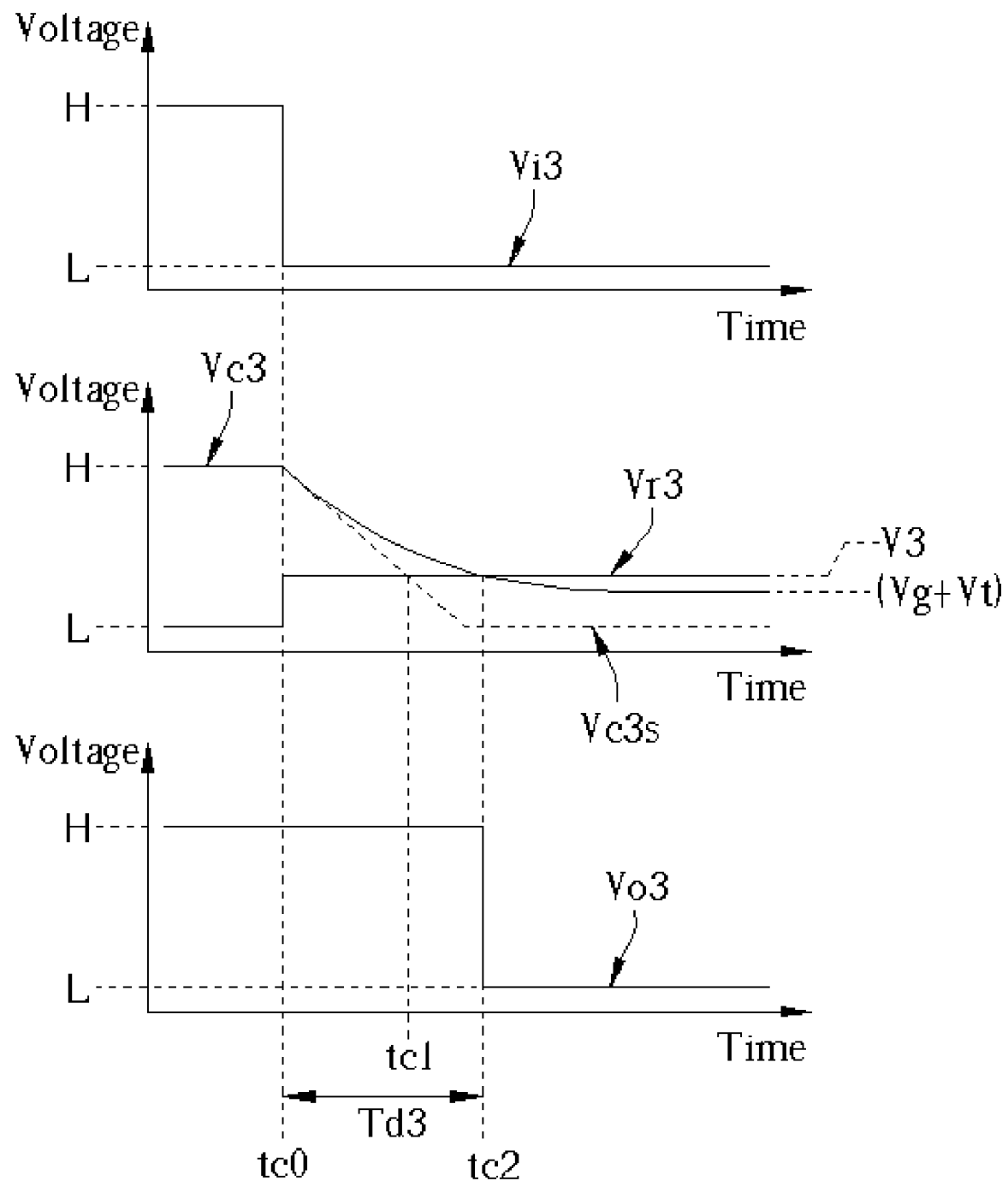
FIG. 12 illustrates a waveform timing diagram of each relative signal when the delay circuit in FIG. 11 is operating.

Similar to the delay circuit 40 in FIG. 7, the highest voltage Vc2 of the transistor Qp8 in the delay circuit 50 is (Vs−Vt) due to the limit of threshold voltage(Vt is the threshold voltage of the transistor Qp8). This decreases the power consumption of the delay circuit 50. When the input signal Vi2 transfers from the level H to the level L to trigger the delay circuit 50, the transistor Qn7 as the storage unit can be discharged directly by the turned-on transistor Qn6 to complete resetting rapidly. In other words, the delay circuit 50 and the delay circuit 40 have the same advantages that the delay circuit with long delay can be implemented by smaller layout area. In the previous two examples of the present invention, the feedback control module is formed by p-type MOSFETs to combine with the current generator of p-type MOSFETs, for adjusting the charging current or discharging the storage unit. Meanwhile, the feedback control module triggers the delay circuit when the input signal transfers from the level L to the level H, produces delay time between input and output signals. Of course, the feedback control module of the present invention can also be implemented as an n-type MOSFET to combine the current generator of an n-type MOSFET. Moreover, the delay circuit can be designed to be triggered by the falling edge of the input signal. In these examples, please refer to FIG. 11 and FIG. 12. FIG. 11 illustrates the delay circuit 60 of a third embodiment in the present invention. FIG. 12 is a waveform timing diagram of each relative signal of the delay circuit 60 in FIG. 11. The horizontal axis represents time and the vertical axis represents voltage magnitude. The delay circuit 60 receives a voltage signal Vi3 as an input signal, and outputs a voltage signal Vo3.

As shown in FIG. 11, p-type MOSFET Qp8 and the resistors Re1 and Re2 form a voltage divider in the delay circuit 60, and is labeled as a voltage generator 62A, which provides the reference voltage Vr3 at node Nc2. N-type MOSFET Qn10 and p-type MOSFET Qp10 form a current generator 62B. When the delay circuit 60 is in operation, the current generator 62B serves as the current source, producing a current Ic3 from node Nc3 to discharge the capacitor Cc. The capacitor Cc can be like a MOSCAP in FIG. 9, serving as the storage unit in the delay circuit 60 so as to produce a discharging voltage Vc3 at node Nc3. N-type MOSFET Qn9 is the feedback control module, and the gate receives the feedback signal, voltage Vc3, to control current Ic3. The amplifier A3 compares the voltage Vc3 and Vr3, by which the output voltage signal Vo3 is produced.

As shown in FIG. 12, the delay circuit 60 of the present invention in FIG. 11 is triggered when input signal Vi3 transfers from the level H to the level L. Before time tc0, input signal Vi3 maintains the level H, and the transistor Qp8 is off. The voltage of the resistor Re2 is zero, keeping the voltage Vr3 in the level L like the ground voltage Vg. Meanwhile, the signal Vi3 of the level L is fed into the inverter 13 and the transistor Qp1 is turned on. In the situation where transistor Qn10 is off, the voltage at node Nc3 is pushed to the level H of the bias voltage Vs. Because two input voltages Vc3 and Vr3 of the amplifier A3 are in the level H and L respectively, output signal Vo3 remains in the level H, as shown in FIG. 12.

Input signal Vi3 transfers from the level H to the level L at time tc0 and triggers the delay circuit 60, turning on the transistor Qp8. Re1 and Re2 divide the voltage Vs, and the voltage Vr3 becomes the level V3 (as shown in FIG. 12; voltage level V3 approximately equals Vs*Re2/(Re1+Re2)). Meanwhile, signal Vi3 in the level L is input in the inverter 13 and then turns off the transistor Qp10. The on-transistor Qn10 and Qn9 discharges the capacitor Cc by current Ic3. As shown in FIG. 12, voltage Vc3 decreases after time tc0 when current Ic3 discharges the capacitor. In addition, the transistor Qn9 as the feedback control module gradually leaves the turned-on mode because the gate voltage Vc3 decreases, and current Ic3 also decreases. Thus, the speed in which the capacitor Cc is discharged is slower, and time for voltage Vc3 to decrease becomes longer. At time tc2, voltage Vc3 becomes lower than voltage Vr3, so the output signal Vo3 of the amplifier A3 transfers from the level H to the level L due to change of the relative magnitude of Vc3 and Vr3. In summary, input signal Vi3 changes the level at time tc0, and after a delay time output signal Vo3 in the delay circuit 60 at time tc2 changes its level. Td3 between time tc0 and time tc2 is the delay time generated by the delay circuit 60.

As known from the description above, the delay circuit 60 of the present invention dynamically decreases current Ic3 when voltage Vc3 of the transistor Qn9 gradually leaves the turned-on mode. Thus, it takes longer for voltage Vc3 to decrease to the level V3 of voltage Vr3, and implement the delay circuit of longer delay. Without the transistor Qn9, the transistor Qn10 becomes a current source, which discharges capacitor Cc with stable current Ic3. In this situation, voltage Vc3 will linearly decrease rapidly. FIG. 12 shows the voltage waveform Vc3s of the dotted line when voltage Vc3 decreases rapidly if the circuit excludes the transistor Qn9. Voltage Vc3 will decrease to the level of voltage Vr3 at time tc1, and the output signal Vo3 of the amplifier A3 changes to the level L from the level H at the advanced time tc1. Thus it can be seen that in the present invention with the feedback control of the current Ic3 by the transistor Qn9, the delay circuit 60 lengthens the delay time rapidly. In addition, the feedback control module in the present invention limits the lower bound which voltage Vc3 decreases to, making the capacitor Cc discharge to(Vg+Vt) at most, of which Vt is threshold voltage of transistor Qn9. Therefore, the delay circuit 60 of the present invention consumes less power. In comparison, to bias the source of the transistor Qn10 at the DC voltage Vg without transistor Qn9, the level of voltage Vc3 will keep decreasing until it arrives at the level L, as voltage Vc3s shows in FIG. 12. This wastes more power when discharging.

Figure 13:
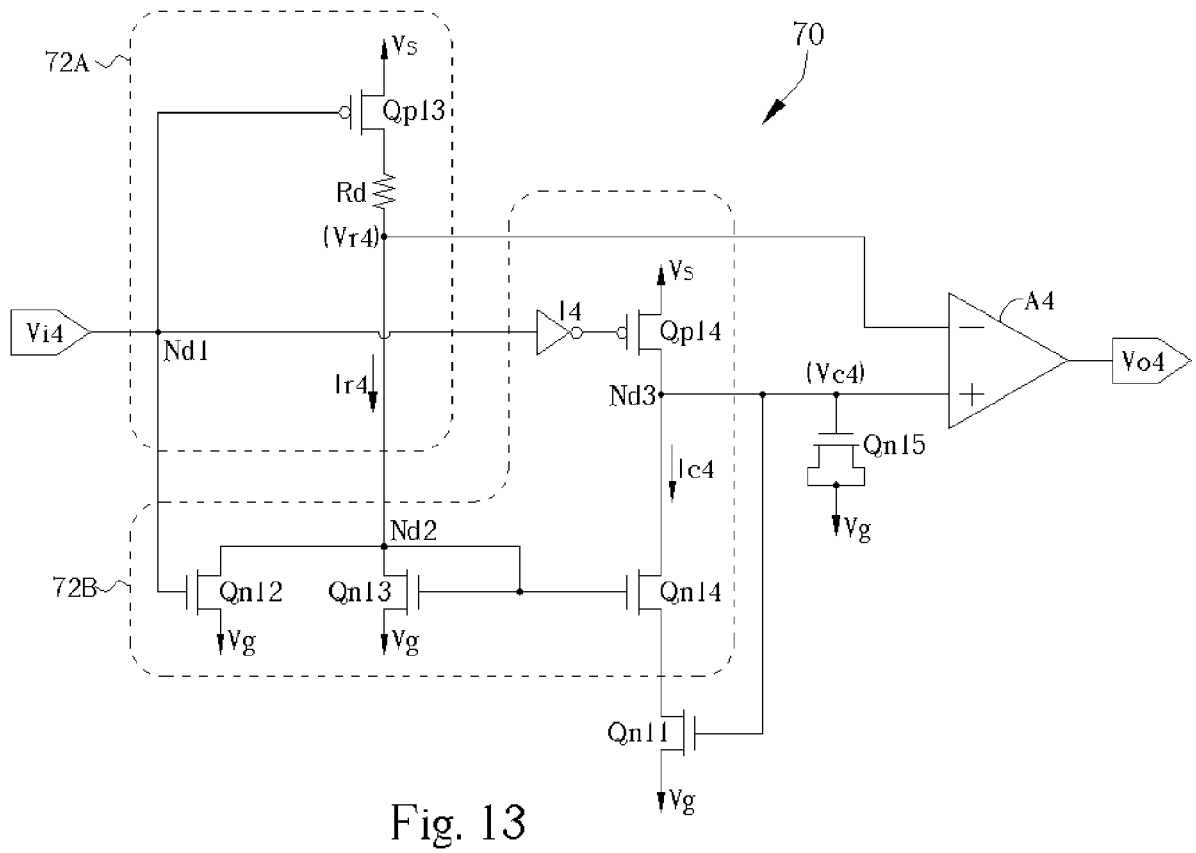
FIG. 13 illustrates a fourth embodiment of the delay circuit of the present invention.
Figure 14:
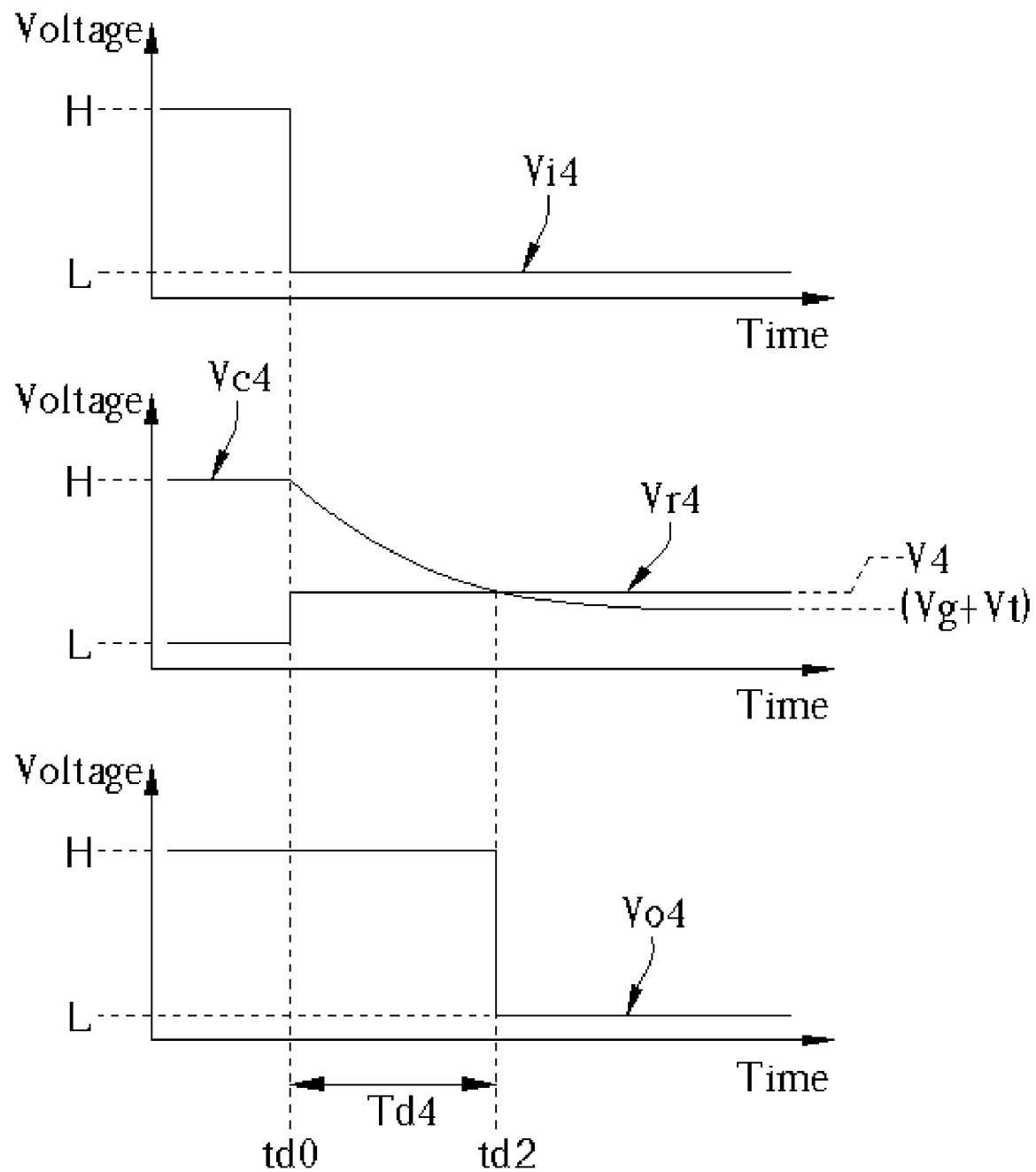
FIG. 14 illustrates a waveform timing diagram of each relative signal when the delay circuit in FIG. 13 is operating.

Please refer to FIG. 13 and FIG. 14. Similar to the embodiment of the present invention in FIG. 9, the present invention can be implemented by a current mirror with n-type MOSFETs. FIG. 13 illustrates another embodiment of the delay circuit 70 in the present invention. FIG. 14 shows a waveform timing diagram of relative signals of the delay circuit 70. The x-axis represents time and the y-axis represents voltage magnitude of the waveform. The delay circuit 70 takes a voltage signal Vi4 as input signal, and when signal Vi4 transfers from the level H to the level L, it triggers the delay circuit 70 and outputs a voltage signal Vo4.

As shown in FIG. 13, the voltage generator 72A of the delay circuit 70 is composed of a p-type MOSFET Qp13 as well as a resistor Rd, and generates a reference voltage Vr4 at node Nd2. N-type MOSFETs Qn13 and Qn14, which are similar to a current mirror, and n-type MOSFET Qn12 form the current generator 72B. When the current generator 72B operates, transistors Qn13 and Qn14 conduct current Ir4 and current Ic4 respectively as a reference and a discharging current. A source and a drain of the N-type MOSFET Qn15(it can also be a p-type MOSFET) are connected together to form a MOSCAP, serving as the storage unit of the delay circuit 70 and generating the voltage Vc4 at node Nd4 for serving as a discharging voltage. An N-type MOSFET Qn11 as the feedback control module controls current Ic4 by the signal fed back to the gate of MOSFET Qn11. Positive and negative inputs of the amplifier A4 receive voltage Vr4 and Vc4 respectively and decide the level of output signal Vo4 by their relative magnitude.

As shown in FIG. 14, when input signal Vi4 maintains the level H before time td0, transistor Qn12 turns on and makes transistors Qn13 and Qn14 turn off, resulting in the level L of the voltage Vr4 at node Nd2. Meanwhile, through the inverter I4, signal Vi4 of the level H also turns on the transistor Qp14, leading to the level H of the voltage Vc4 at node Nd4. Because the voltage Vc4 in the level H is larger than the voltage Vr4 in the level L, the amplifier A4 keeps the output signal Vo4 in the level H.

Input signal Vi4 transfers from the level H to the level L at time td0 and triggers the delay circuit 40, turning off the transistor Qn12. Accompanied with the turned-on transistor Qp13, transistors Qn13 and Qn14 conduct current Ir4 and Ic4 respectively. The current Ir4, which flows through the resistor Rd, produces a voltage Vr4 of the level V4 (voltage level V4 approximately equals Vs−Ir4*Rd). Meanwhile, with the off-transistor Qp14, current Ic4 discharges the storage unit, formed by the transistor Qn15, and the voltage Vc4 at node Nd3 decreases from the level H. During the decrease of the voltage Vc4, the transistor Qn11 the gate of which is controlled by voltage Vc4 gradually leaves the turned-on mode, and accordingly current Ic4 decreases, retarding the decrease of the voltage Vc4. At time td2, voltage Vc4 falls below the level V4 of the voltage Vr4, and the amplifier A4 changes the signal Vo4 from the level H to the level L. Td4 generated between the signal Vi4 an Vo4 is the delay time.

Similar to the embodiment of the present invention in FIG. 9, the embodiment 70 has longer delay, lower power consumption and fast resetting.

The delay circuit of the present invention generates delay in the following mechanism. A current generating circuit triggered by the level change of the input signal generates a current to charge or discharge the storage unit. Then, an amplifier compares the charging voltage generated by the storage unit and the reference voltage produced by the voltage generator. When the relative magnitude of charging voltage and reference voltage changes, the level of the output signal also changes. The delay time is therefore generated between the level change of the input signal and output signal. When the level of charging voltage approaches the level of reference voltage, the feedback control module of the present invention will dynamically decrease the charging/discharging current passed to the storage unit by the current transmission circuit, slowing the speed in which charging voltage reaches the reference voltage so as to implement a longer delay. Compared to the conventional resistor-capacitor delay circuit, or the conventional delay circuit with fixed charging current source, the delay circuit of the present invention consumes less power and implement a longer delay with smaller layout area. Delay circuits of the present invention used in the flash memory can reduce the total chip area of the flash memory, and generate enough delay time for the flash memory to do data-programming/data-erasing so that the flash memory will operate correctly.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A delay circuit for providing an output signal according to an input signal so that when the level of the input signal changes from a first input level to a second input level, the level of the output signal changes from a first output level to a second output level after a predetermined delay time, the delay circuit comprising:
    a voltage generator for providing a reference voltage when the input signal changes from the first input level to the second input level;
    a current generator for providing a charging current when the input signal changes from the first input level to the second input level;
    a feedback control module comprising a control end and two transmit ends, the control end for receiving a charging voltage, and the feedback control module able to transmit the charging current from the current generator between the two transmit ends, and the feedback control module changing the proportion between a cross voltage of the two transmit ends and the current flowing between the two transmit ends;
    a storage unit electrically connected to the current generator and the control end of the feedback control module for receiving the charging current from the feedback control module and thereby generating the charging voltage; and
    an amplifier having two input ends electrically connected to the storage unit and the voltage generator in order to receive respectively the charging voltage and the reference voltage, the amplifier able to change the level of the output signal from the first output level to the second output level when the relationship between the reference voltage and the charging voltage changes.

2. The delay circuit of claim 1 wherein the closer the charging voltage is to the reference voltage, the less charging current is transmitted from the feedback control module to the storage unit.

3. The delay circuit of claim 1 wherein a first transmit end of the two transmit ends of the feedback control module is electrically connected to a stable direct current (DC) voltage, and when the charging current transmitted to the storage unit is close to 0, a cross voltage between the transmit end and the control end of the feedback control module substantially maintains a predetermined value instead of 0.

4. The delay circuit of claim 1 wherein the feedback control module comprises a metal-oxide semiconductor (MOS) transistor with a gate electrically connected to the control end, and a source and a drain electrically connected to the two transmit ends.

5. The delay circuit of claim 1 wherein the current generator comprises a current mirror for generating the charging current and a reference current and maintaining a predetermined proportion between the charging current and the reference current, and the voltage generator generates the reference voltage according to the reference current.

6. The delay circuit of claim 1 wherein the storage unit is a capacitor being a MOS transistor with a source and a drain connected to each other.

7. The delay circuit of claim 1 wherein when the input signal recovers from the second input level to the first input level, the delay circuit changes the output signal from the second output level to the first output level.

8. The delay circuit of claim 7 wherein when the input signal recovers from the second input level to the first input level, the feedback control module stops transmitting the current between the two transmit ends.

* * * * *